(12) United States Patent
Xiao

(10) Patent No.: US 10,697,704 B2
(45) Date of Patent: Jun. 30, 2020

(54) LIQUID-COOLED HEAT DISSIPATION SYSTEM AND WATER RESERVOIR THEREOF

(71) Applicant: Apaltek Co., LTD, ShenZhen (CN)

(72) Inventor: Qineng Xiao, DongGuan (CN)

(73) Assignee: APALTEK CO., LTD, Shenzhen (CN)

( * ) Notice: Subject to any disclaimer, the term of this patent is extended or adjusted under 35 U.S.C. 154(b) by 92 days.

(21) Appl. No.: 16/183,695

(22) Filed: Nov. 7, 2018

(65) Prior Publication Data

US 2019/0072334 A1 Mar. 7, 2019

(30) Foreign Application Priority Data

May 15, 2018 (CN) .......................... 2018 1 0462540

(51) Int. Cl.
| | | |
|---|---|---|
| *F28D 15/00* | (2006.01) | |
| *F28D 1/02* | (2006.01) | |
| *H01L 23/473* | (2006.01) | |
| *F28D 1/06* | (2006.01) | |
| *G05D 23/19* | (2006.01) | |
| *F28D 21/00* | (2006.01) | |

(52) U.S. Cl.
CPC ............. *F28D 1/024* (2013.01); *F28D 1/06* (2013.01); *F28D 15/00* (2013.01); *G05D 23/1919* (2013.01); *H01L 23/473* (2013.01); F28D 2021/0029 (2013.01); F28D 2021/0031 (2013.01); *F28F 2250/08* (2013.01)

(58) Field of Classification Search
CPC . F28D 1/024; F28D 1/06; F28D 15/00; F28D 2021/0029; F28D 2021/0031; G05D 23/1919; H01L 23/473; F28F 2250/08

USPC ...................................................... 165/104.25
See application file for complete search history.

(56) References Cited

U.S. PATENT DOCUMENTS

| | | | | |
|---|---|---|---|---|
| 3,229,456 A | * | 1/1966 | Gratzmuller | .......... F01P 3/2207 123/41.01 |
| 2007/0056295 A1 | * | 3/2007 | De Vilbiss | ........... B67D 1/0869 62/3.64 |
| 2010/0307431 A1 | * | 12/2010 | Buchanan | ........... F02D 41/0027 123/3 |
| 2013/0305752 A1 | * | 11/2013 | Martin | .................. F24F 3/1417 62/91 |
| 2016/0123637 A1 | * | 5/2016 | Moreno | ................... F25B 39/02 62/516 |

* cited by examiner

*Primary Examiner* — Davis D Hwu
(74) *Attorney, Agent, or Firm* — Bayramoglu Law Offices LLC

(57) ABSTRACT

The invention discloses a water reservoir of a liquid-cooled system. The water reservoir is integretedly interconnected to the power system. The water reservoir is partitioned into a water inflow tank and a water outflow tank in a top-bottom or left-right manner. The water inflow tank and the water outflow tank are both provided with at least two water inlets and water outlets. Also, the present invention discloses a liquid-cooled system made by using the above-mentioned water reservoir, which includes a heat dissipation device and a heat absorption device connected to the water reservoir. The heat dissipation device is integretedly connected to the water reservoir. The heat absorption device is connected to the water reservoir through pipes.

10 Claims, 13 Drawing Sheets

LIQUID-COOLED HEAT DISSIPATION SYSTEM AND WATER RESERVOIR THEREOF

CROSS REFERENCE TO RELATED APPLICATIONS

This application is based upon and claims priority to Chinese Patent Application No. CN201810462540.X, filed on May 15, 2018, the entire contents of which are incorporated herein by reference.

TECHNICAL FIELD

The present invention relates to a heat dissipation system, in particular to a liquid-cooled heat dissipation system suitable for electronic equipment and a water reservoir thereof.

BACKGROUND

Nowadays, the electronic device such as a CPU, a graphics card, a chip of electronic apparatus, etc. is usually cooled by liquid-cooled radiator, which is mainly composed of three main parts, namely, a heat absorption device, a power system, and a heat dissipation device. The three parts are connected to form a closed liquid circulation loop. The heat-absorption device is connected to the heat-emitting body. The power system provides power for the liquid to circulate in the loop. This design includes the following defects. The three parts are assembled and fixed by an external connection of the connecting pipes, so there are a large number of joints. As a result, there is a high risk of liquid leakage, the device will occupy a large space, the installation and operation are inconvenient, the requirement for the installation space is high, and installation flexibility is poor, thereby greatly limiting its application. At present, the electronic products on the market have more and more heat sources, and the requirements to the performance of the heat dissipation system become higher.

SUMMARY

The present invention provides a water reservoir and a liquid-cooled system made by using the water reservoir to solve the technical problem that the liquid-cooled system of the prior art has defects.

The present invention uses the following technical solution to solve the technical problem. A water reservoir of a liquid-cooled heat dissipation system, wherein the liquid-cooled heat dissipation system includes a water reservoir, a power system, a heat absorption device, a heat dissipation device, and pipelines. The water reservoir is interconnected integretedly in structure to the power system. The water reservoir is integrated in structure, and an interior of the water reservoir is divided into at least one set of water inflow tank and at least one set of water outflow tank. The water inflow tank and the water outflow tank are provided with at least two sets of water inlets and water outlets.

The power system is a pumping device including a pump housing, a pump core and a motor. The pump housing is interconnected to the water reservoir integretedly in structure. The pump core and the motor are configured on the pump housing.

The water inlets and the water outlets are respectively connected to the heat absorption device through the pipelines, and are connected to at least two sets of the heat absorption devices.

The water reservoir is integrated in structure, and N water reservoirs are provided (N is greater than or equal to 1). The whole water reservoir is divided into a water inflow tank and a water outflow tank. The relative position of the water inflow tank and water outflow tank after division is angled, front-rear, top-bottom or left-right. Or, the whole water reservoir is cylinder-shaped, the water inflow tank and the water outflow tank correspond to an inner cylinder and an outer cylinder, respectively.

The pumping device is configured at a side, a middle, or both sides of the water reservoir.

The water reservoir with the integrated structure is interconnected to the power system, and a processing method of an integrated structure includes, but not limited to: a welding, a casting, a numerical control milling machining, or a 3D printing molding.

A liquid-cooled system made by using the water reservoir of the present invention includes a water reservoir, a power system, a heat absorption device, a heat dissipation device, and pipelines. The water reservoir and the power system interconnected integretedly in structure to the water reservoir are connected integratedly in structure to the heat dissipation device.

A liquid-cooled system made by using the water reservoir of the present invention includes a water reservoir, a power system, a heat absorption device, a heat dissipation device, and pipelines. The water reservoir and the power system interconnected integretedly in structure to the water reservoir are connected integratedly in structure to the heat dissipation device through the pipelines.

The water reservoir and the power system interconnected integretedly in structure to the water reservoir are connected integretedly in structure to the heat dissipation device, and a relative position after connecting is, but not limited to, angled, top-bottom, or left-right.

The water reservoir and the power system interconnected integretedly in structure to the water reservoir are connected integretedly in structure to the heat dissipation device, and a processing method of an integrated structure includes, but not limited to, a welding, a casting, a computer numerical control milling machining, or a 3D printing molding.

Compared with the separated design, the liquid-cooled heat dissipation system of the present invention saves the occupation space of the equipment and facilitates the installation and use through the design of integratedly interconnecting the pumping device to the water reservoir. By dividing the water reservoir, and providing at least two water inlets and at least two water outlets on the water inflow tank and the water outflow tank, the liquid inside the water reservoir can be uniformly divided and shunted, so as to dissipate heat from a plurality of heating devices. Meanwhile, according to different equipment requirements, the liquid-cooled heat dissipation system can meet requirements for customized heat dissipation of different electronic equipment.

BRIEF DESCRIPTION OF THE DRAWINGS

In order to clearly illustrate the technical solutions of the embodiments of the present invention, the drawings needed for the descriptions of the embodiments are briefly introduced below. Obviously, the drawings described below are merely some embodiments of the present invention, for those of ordinary skill in the art, other drawings can be derived according to these drawings without creative efforts. In the drawings.

DETAILED DESCRIPTION OF THE EMBODIMENTS

Figure 1:
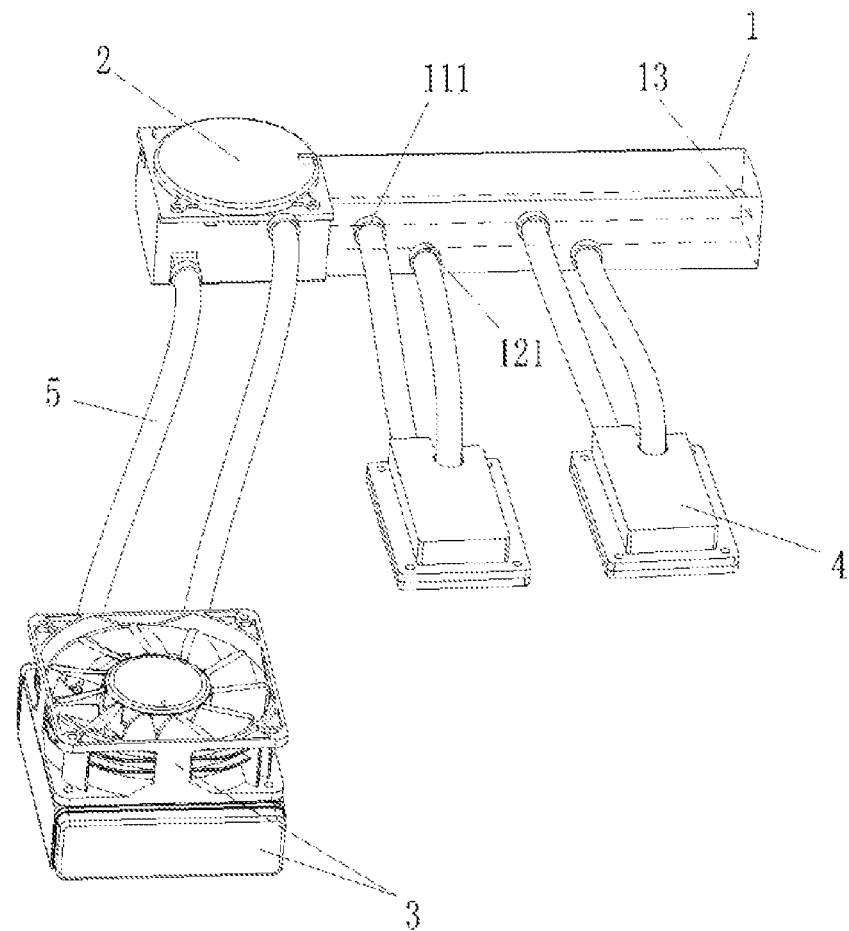
FIG. 1 is a first structural schematic diagram of a liquid-cooled heat dissipation system of the present invention.
Figure 2:
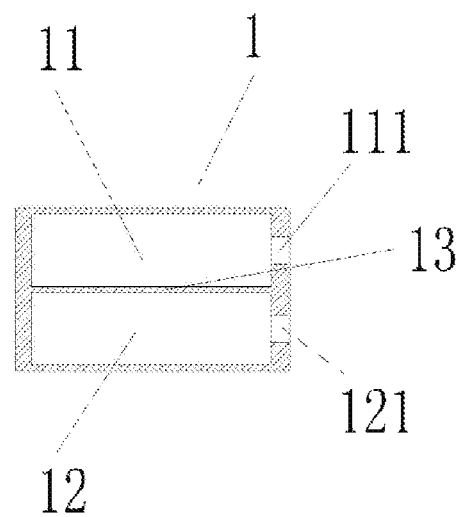
FIG. 2 is a structural schematic diagram showing a sectional view of the water reservoir in FIG. 1.

In order to clarify the objectives, technical solutions and advantages of the present invention, the embodiments will be described hereinafter with reference to the corresponding drawings, and these drawings constitute a part of the embodiments. Various embodiments that may be implemented to realize the present invention are described. It should be understood that the present invention may further include other embodiments, or modifications of the listed embodiments in structure and function without departing from the scope and essence of the present invention.

Referring to FIG. 1 to FIG. 4, the liquid-cooled heat dissipation system of the present invention includes a water reservoir 1, a pumping device 2, a heat dissipation device 3, a heat absorption device 4, and pipelines 5. The pipelines 5 are used to connect the water reservoir 1, the heat dissipation device 3, and the heat absorption device 4. The pumping device 2 and the water reservoir 1 are designed with an integrated structure, namely, the pumping device 2 is integratedly configured on the water reservoir 1 and is interconnected to the water reservoir 1. Compared with the separated design, without the pipelines for connection, it is obvious that the space occupied by the installation would be greatly reduced, thereby facilitating the operations. The water reservoir 1 is partitioned into a water inflow tank 11 and a water outflow tank 12 by a division plate 13. The water inflow tank 11 and the water outflow tank 12 are each provided with at least two sets of water inlets 111 and water outlets 121. One set of water inlet 111 and water outlet 121 is connected to one heat absorption device. The water reservoir 1 may be connected in parallel to at least two sets of heat absorption devices 4. By uniformly configuring N (N is equal to or greater than 2) sets of water inlets 111 and water outlets 121 on the water inflow tank 11 and the water outflow tank 12, a uniform shunting of the liquid is realized, and the heat of N heat sources can be dissipated.

Figure 3:
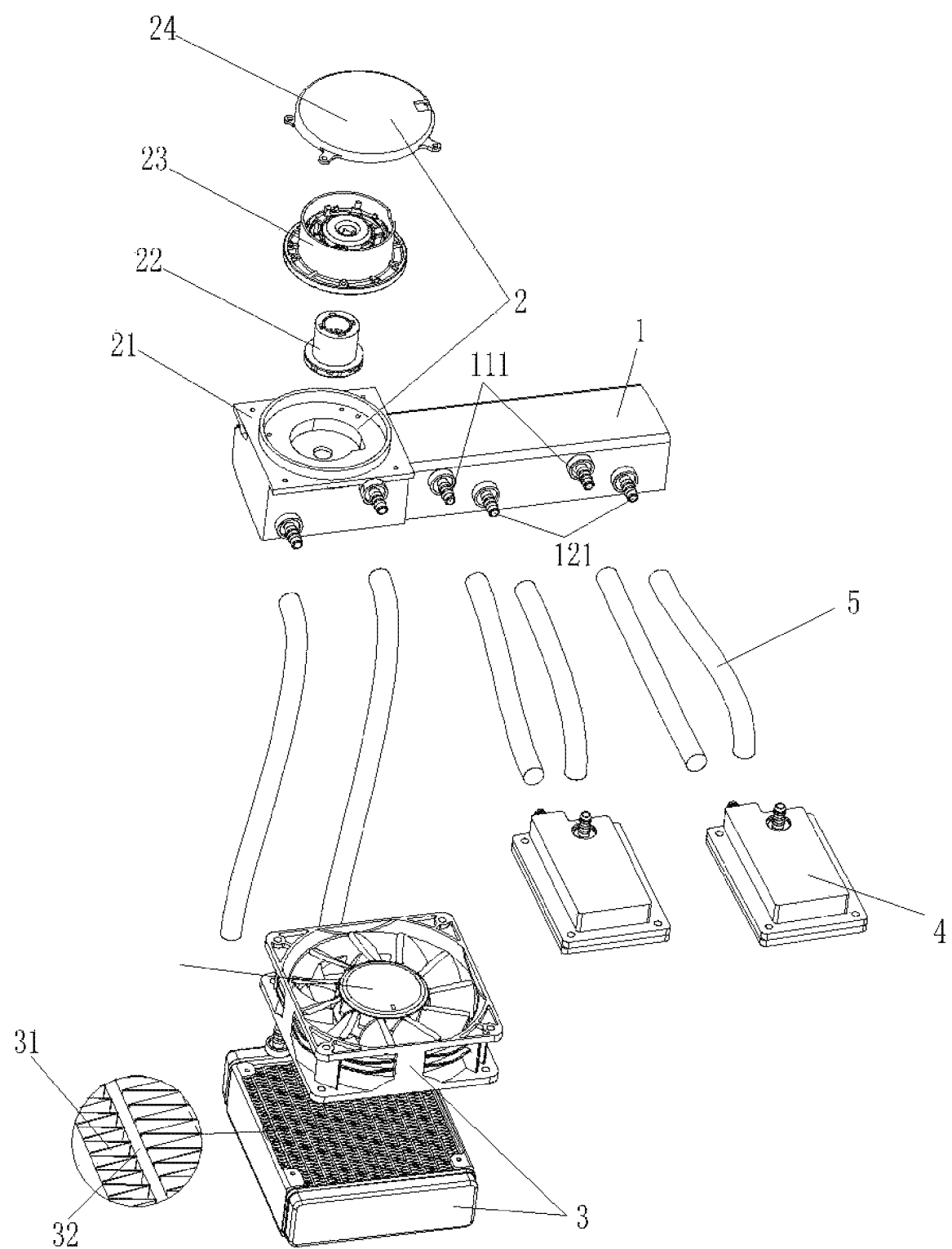
FIG. 3 shows an exploded structural schematic diagram of FIG. 1 and a partially enlarged schematic diagram of a heat dissipation structure.
Figure 4:
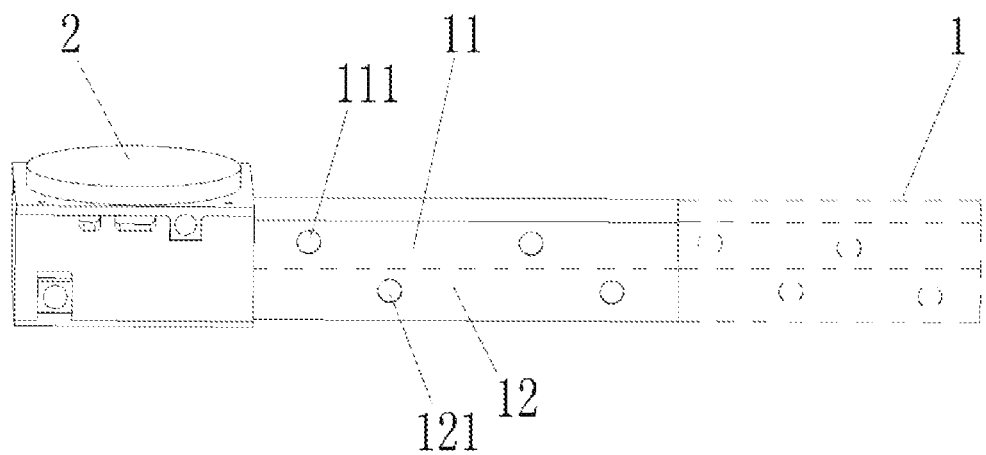
FIG. 4 is a planar structural schematic diagram showing that a pumping device and is integratedly formed with the water reservoir and the water reservoir is provided with a plurality of water inlets/outlets of the present invention.

In detail, referring to FIG. 3, the pumping device 2 of the present invention includes a pump housing 21, a pump core 22, a motor device 23, and a pump cover 24. The pump core 22 and the motor device 23 are configured on the pump housing 21. The pump housing 21 and the water reservoir 1 are integrated in structure. Referring to FIG. 3, the heat dissipation device 3 includes heat dissipation fins 31. The heat dissipation fins 31 are provided with at least one cooling pipe 32. A heat dissipation fan is configured on the heat dissipation fins 31. By configuring a plurality of cooling pipes 32, the heat dissipation rate is greatly increased.

The liquid circulation process of the liquid-cooled heat dissipation system of the present invention is as follows.

Figure 5:
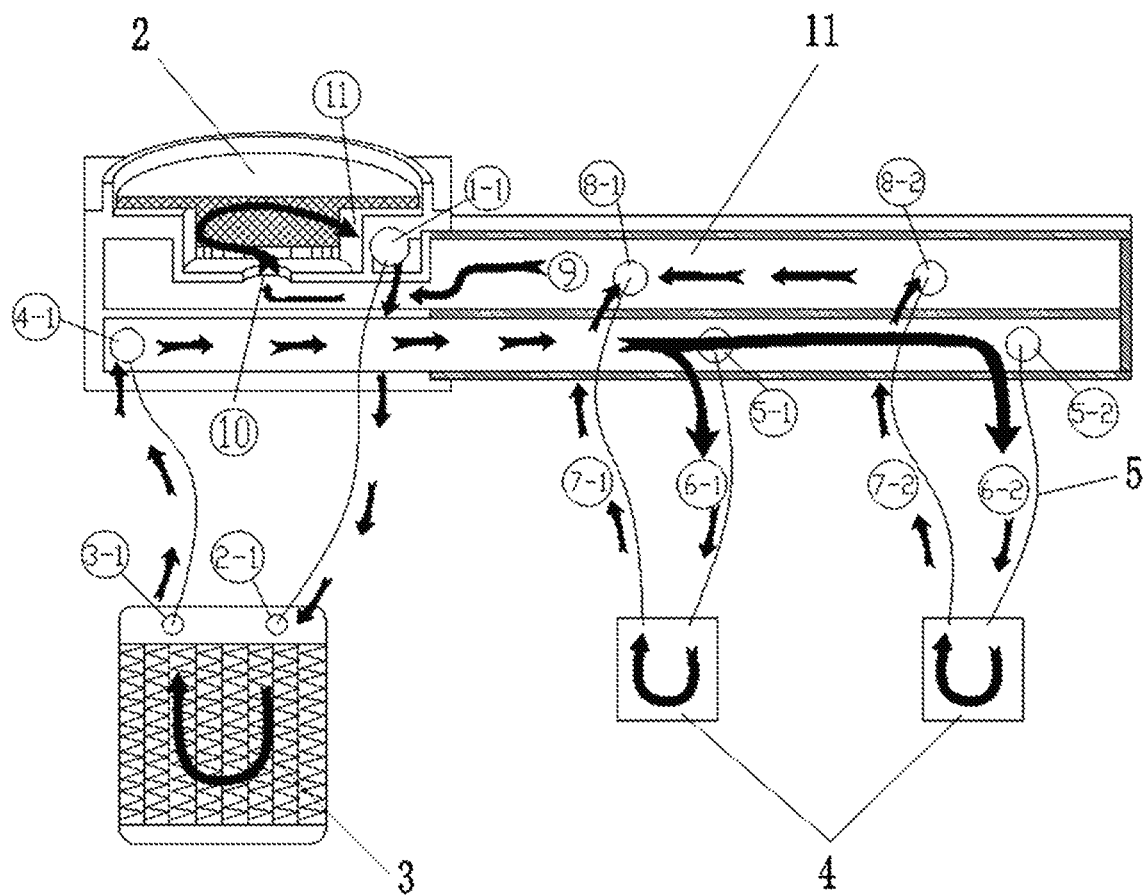
FIG. 5 is a flow diagram showing the liquid circulation of the liquid-cooled system of the present invention.

Referring to FIG. 5, the cavity of the pumping device 2 is divided into an upper layer and a lower layer, which are respectively interconnected with the water inflow tank 11 and the water outflow tank 12 of the water reservoir. Under the pressure of the pumping device 2, the liquid enters into a water inlet ②-① of the heat dissipation device 3 through a water outlet ①-① of the pump housing. After cooling, the liquid enters into an inlet ④-① of the water outflow tank 12 from the water outlet ③-①, and then is uniformly shunted to a water outlet ⑤-① and the water outlet ⑤-② of the water outflow tank 12. Then, the liquid enters the heat absorption device 4 through the water outflow pipes ⑥-① and ⑥-②. After absorbing heat, the liquid flows to water inlets ⑧-① and ⑧-② of the water inflow tank 11 through the pipelines ⑦-① and ⑦-②, respectively to enter the water inflow tank 11, then the liquid enters an inlet ⑩ of the pumping device 2 along a direction ⑨ of the water inflow tank 11. Under pressure, the liquid flows to the water outlet ⑴-⑴ of the pumping device through a passage ⑪, thereby getting ready for the next heat dissipation circulation.

Figure 6:
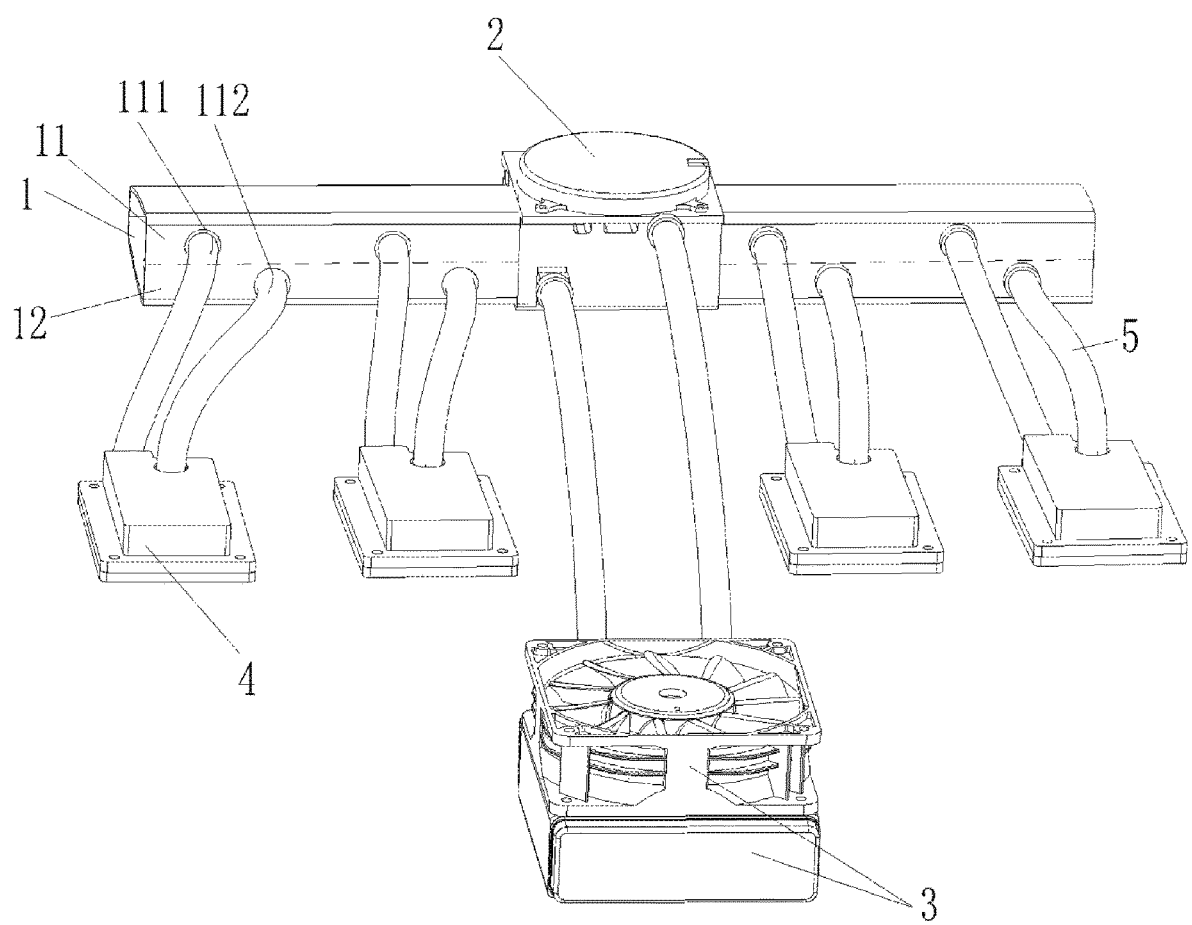
FIG. 6 is a structural schematic diagram showing that two water reservoirs of the liquid-cooled heat dissipation system of the present invention are partitioned in a top-bottom manner and arranged on two sides of the pumping device.

Referring to FIG. 6, the water inflow tank 11 and the water outflow tank 12 are arranged in a top-bottom manner, and are arranged in a left-right manner with respect to the pumping device 2. As can be seen from the figures, with a symmetrical configuration at left and right sides and the shunting design of the water reservoir, the heat dissipation system can be connected to four heat absorption devices 4. Certainly, the amount of water reservoirs may be equal to or greater than 2, and the amount of the heat absorption device 4 may be equal to or greater than 4, so as to meet the heat dissipation requirement of more devices.

Figure 7:
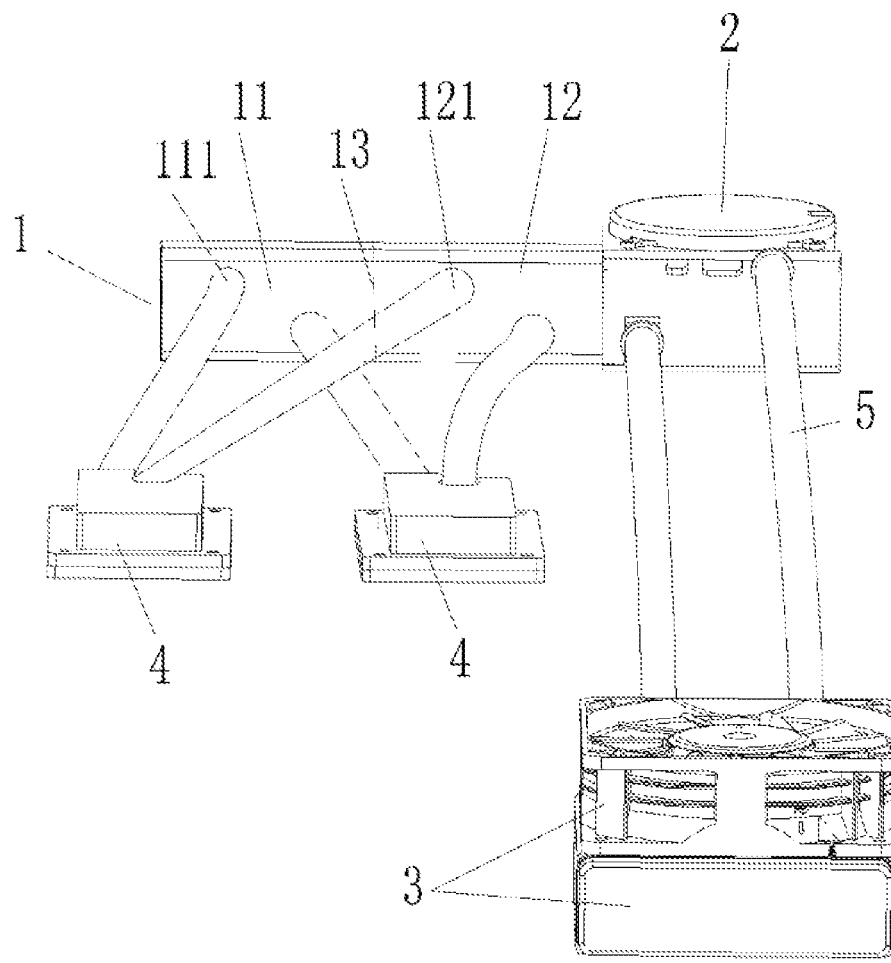
FIG. 7 is a structural schematic diagram showing that a water reservoir of the liquid-cooled heat dissipation system of the present invention is partitioned in a left-right manner and arranged at one side of the pumping device.
Figure 8:
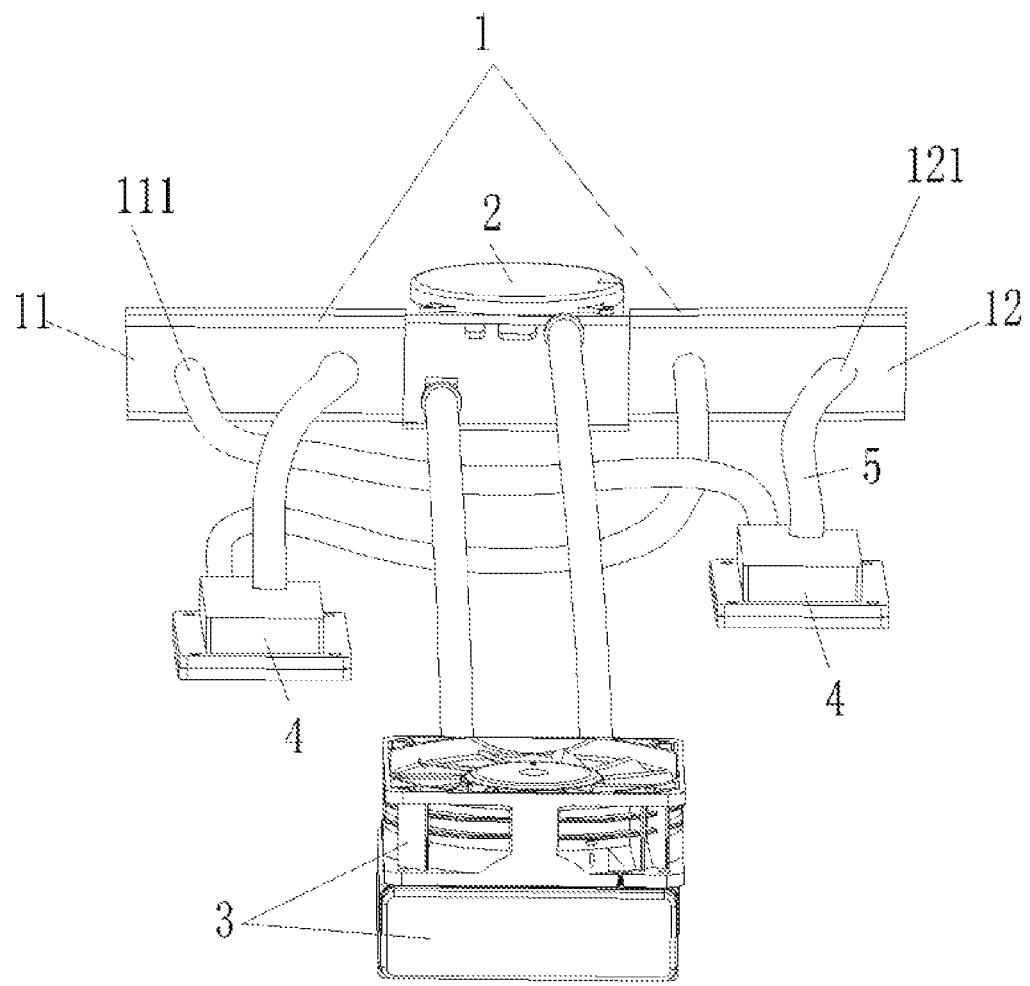
FIG. 8 is a structural schematic diagram showing that the water reservoir is partitioned in a left-right manner as shown in FIG. 7 and arranged at two sides of the pumping device.
Figure 9:
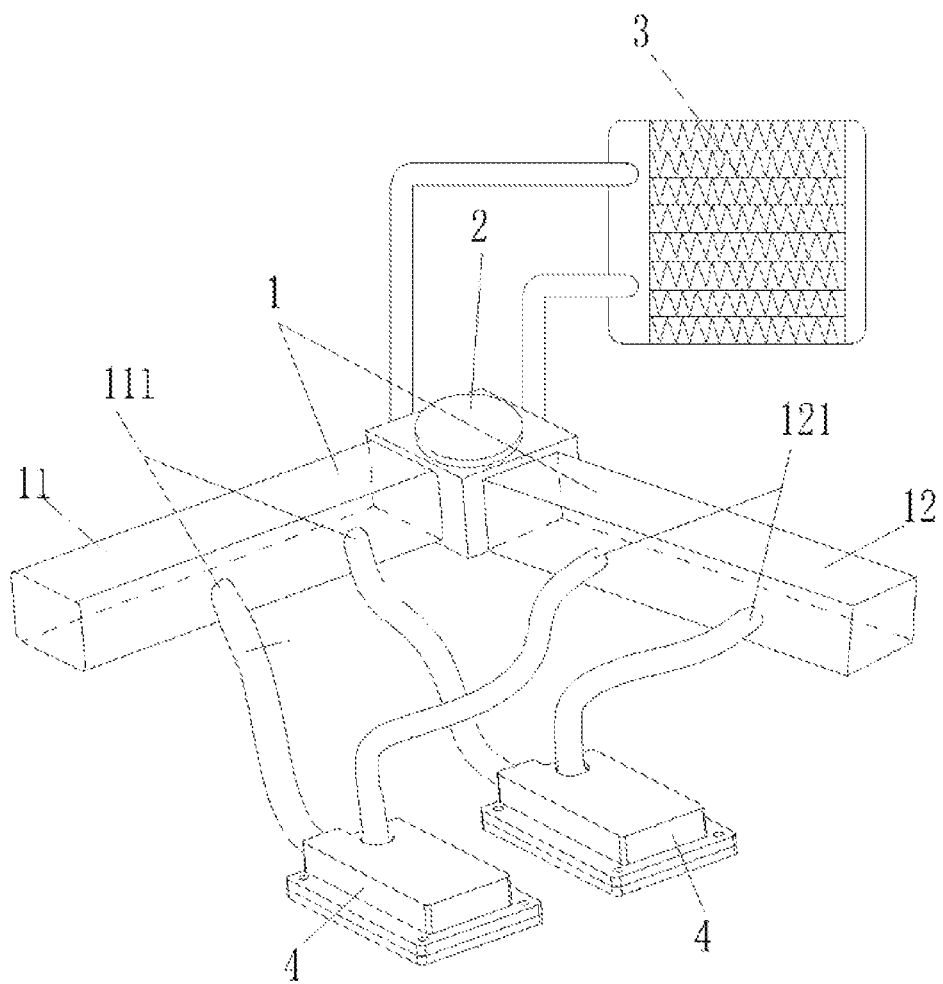
FIG. 9 is a structural schematic diagram showing that the water reservoir is partitioned in a left-right manner as shown in FIG. 7 and arranged at the corner of the pumping device.
Figure 16:
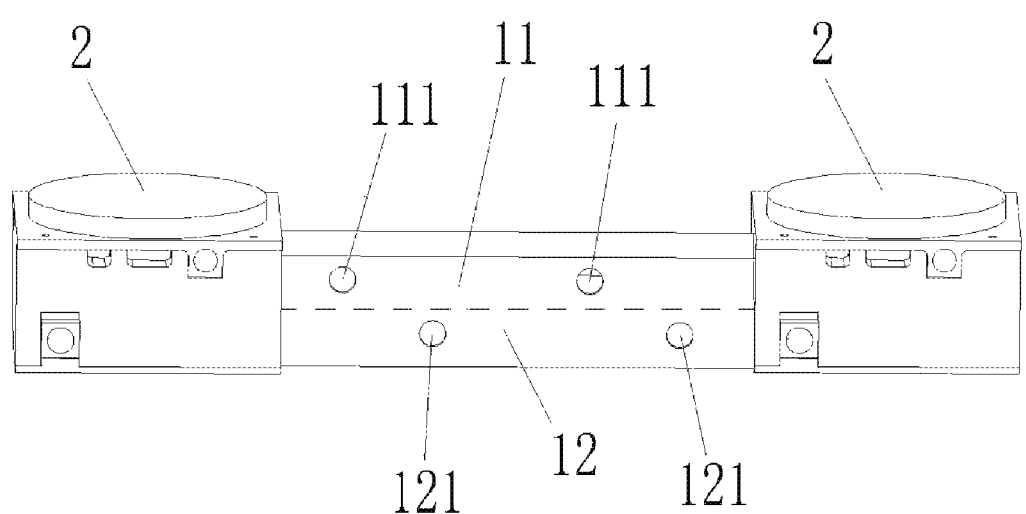
FIG. 16 is a structural schematic diagram showing that the pumping device of the liquid-cooled heat dissipation system of the present invention is configured at two sides of the water reservoir.

Referring to FIGS. 7 to 9, the water inflow tank 11 and the water outflow tank 12 of the liquid-cooled heat dissipation system of the present invention may be configured on one side of the pumping device 2, separately configured on both sides of the pumping device 2, or arranged at an angle with respect to the pumping device 2. All of these methods can realize the functions of the present invention, and the arrangement is relatively flexible. Referring to FIG. 16, both sides of the water reservoir 1 may be each provided with a power system, namely, two pumping devices 2 are configured. Compared with one pumping device, the power of the liquid circulation is greatly increased, thereby improving the heat dissipation efficiency of the heat dissipation system of the liquid-cooled heat dissipation system of the present invention.

Figure 10:
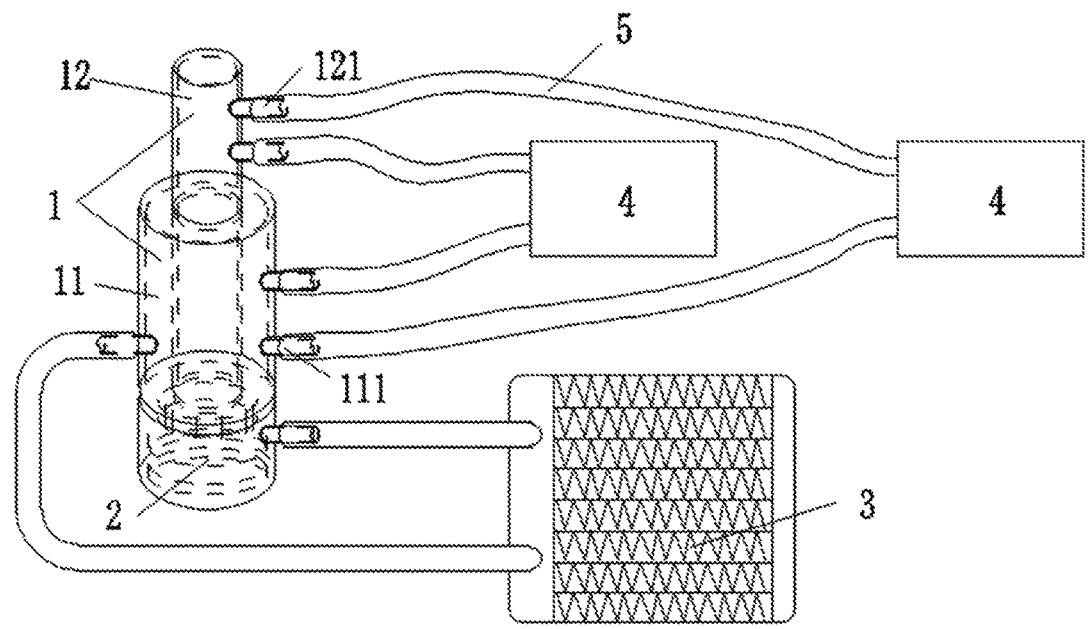
FIG. 10 is a structural schematic diagram showing that the water reservoir of the liquid-cooled system of the present invention is designed as a cylindrical shape and configured above the pumping device.

Especially, referring to FIG. 10, the water reservoir 1 may have a cylindrical shape surrounding on the top of the pumping device 2. Specifically, the inner cylinder is the water outflow tank 12, which is placed on the pumping device 2. The area between the surface of the outer cylinder and the surface of the inner cylinder is the water inflow tank 11. By designing the water reservoir 1 with the same circular shape as the pumping device 2 and configuring the water reservoir 1 on the top the pumping device 2, the occupied space is greatly reduced with respect to the configuration that the pumping device is located at the sides. Moreover, since the water outflow tank 12 is configured along the direction of the impeller of the pumping device 2, the liquid transportation is facilitated.

A liquid-cooled system made by using the water reservoir described above includes a water reservoir, a power system, a heat absorption device, a heat dissipation device, and pipelines. The water reservoir is interconnected integratedly in structure to the power system, and the water reservoir is connected to the heat dissipation device and the heat absorption device by pipelines. The method for integratedly connecting the water reservoir and the power system may be welding, casting, numerical control milling machining, or 3D printing molding. Compared with the existing separated design of the water reservoir and power system, the structure saves occupied space and facilitates the use.

Figure 11:
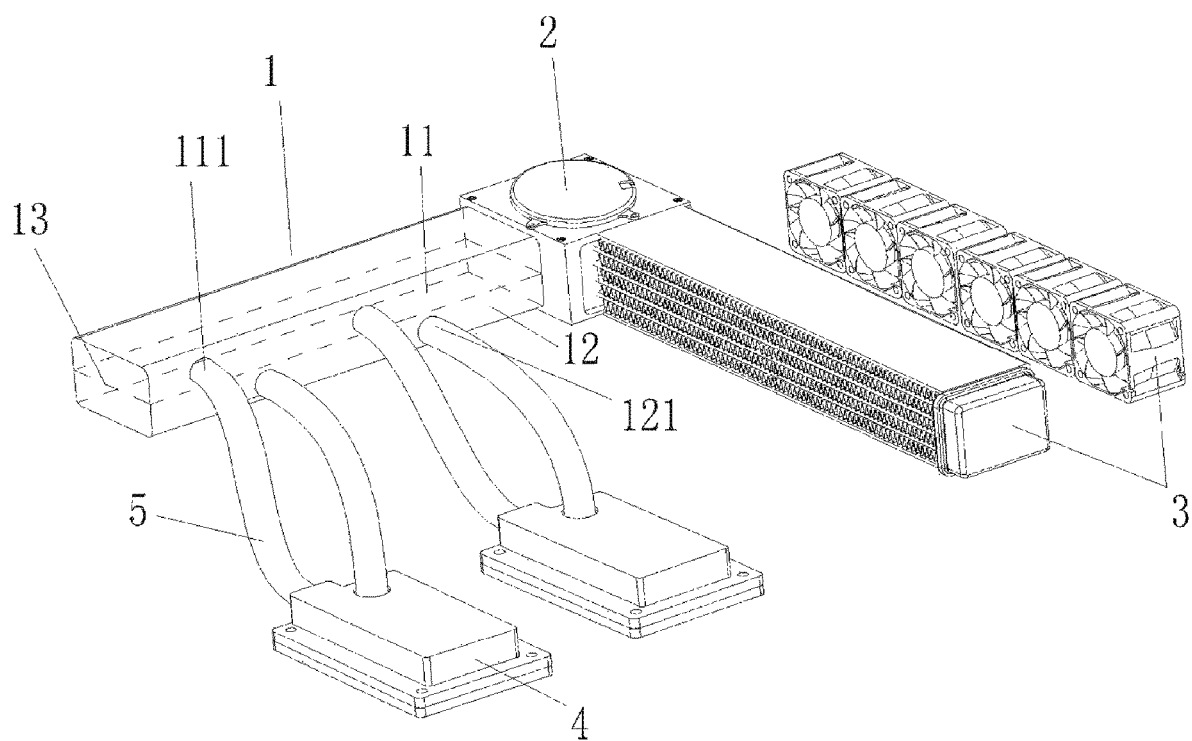
FIG. 11 is a structural schematic diagram showing that the heat dissipation device and the pumping device of the water reservoir of the liquid-cooled heat dissipation system of the present invention are integratedly designed with a corner.
Figure 12:
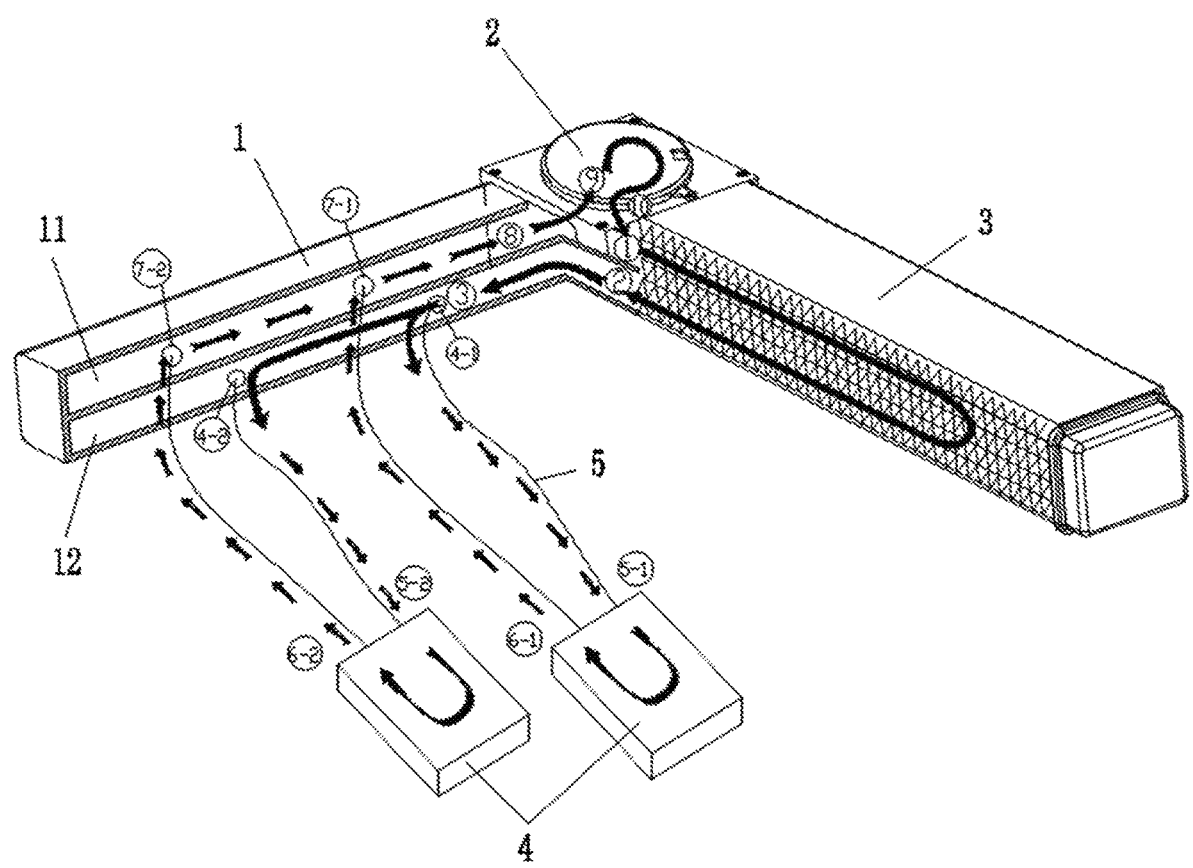
FIG. 12 is a schematic diagram showing the liquid circulation flow of the design that the heat dissipation device and the pumping device of the water reservoir of the liquid-cooled heat dissipation system of the present invention are integratedly formed with a corner.
Figure 13:
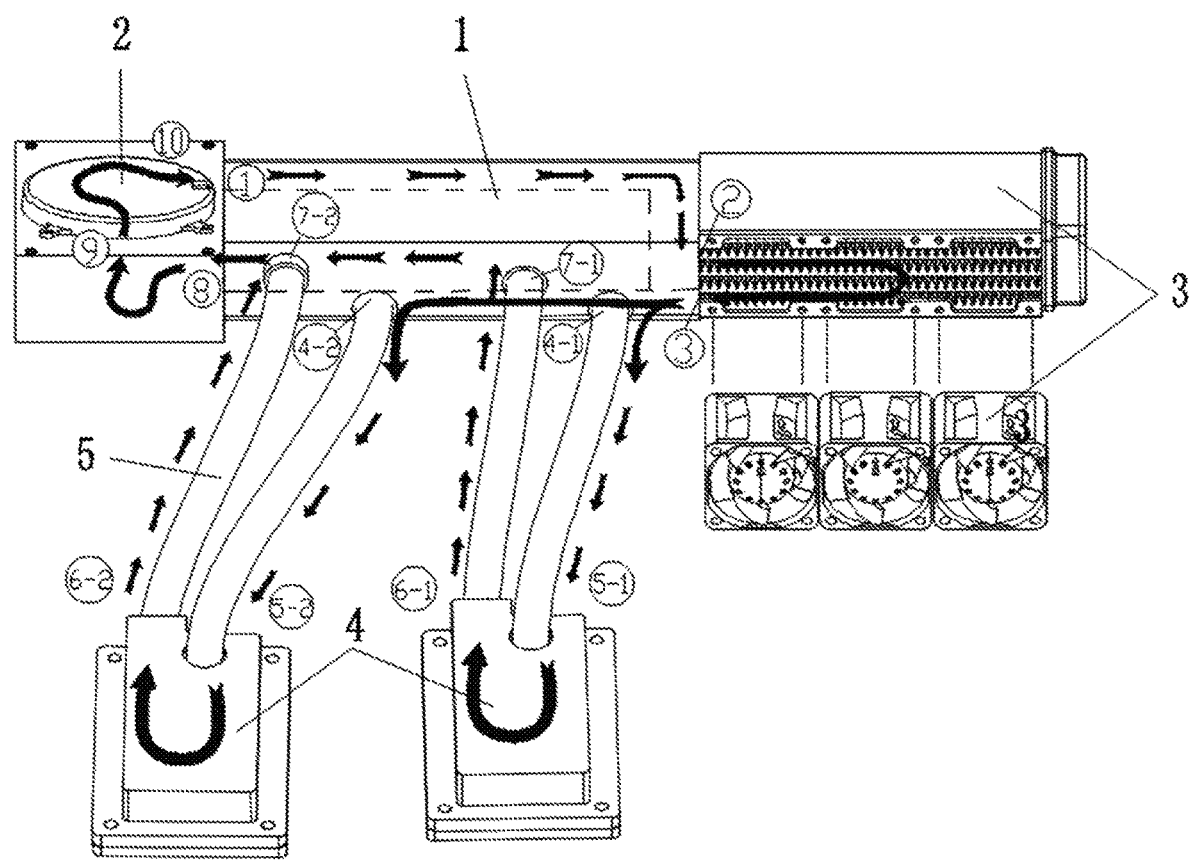
FIG. 13 is a schematic diagram showing the heat dissipation device of the liquid-cooled heat dissipation system of the present invention, the left and right sides of the water reservoir with the integrated structure being connected in a straight line, and the liquid circulation flow thereof.
Figure 14:
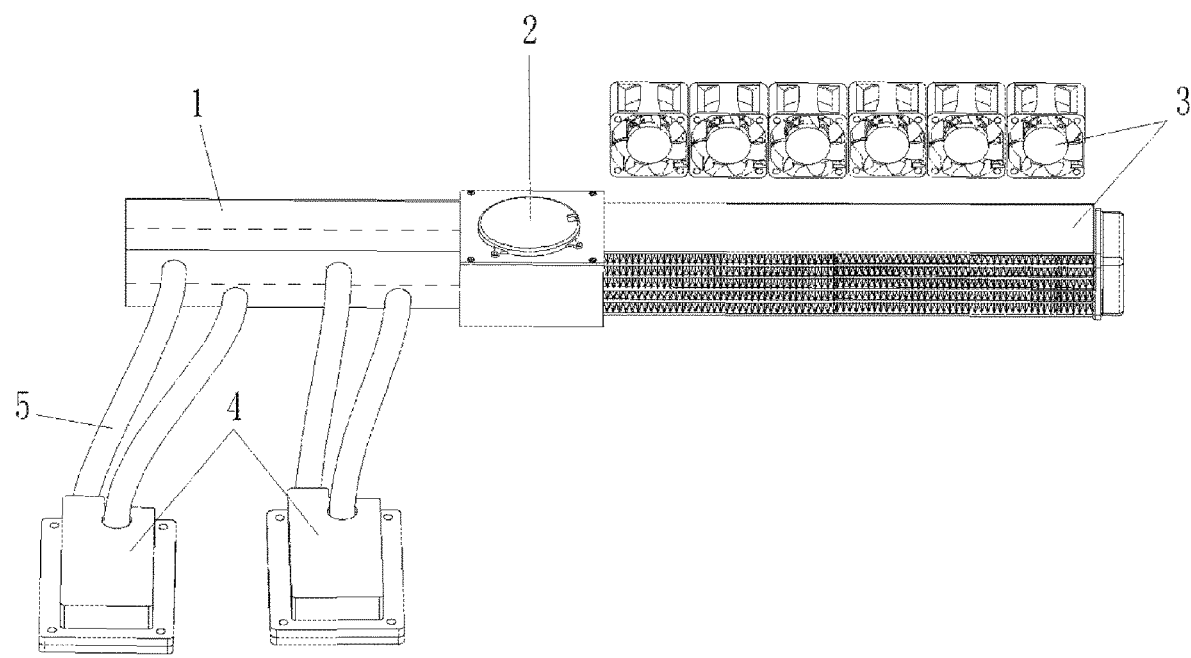
FIG. 14 is a schematic diagram showing that the heat dissipation device of the liquid-cooled heat dissipation system of the present invention connected to the pumping device of the water reservoir with the integrated structure in a straight line.

Further, the heat dissipation device 3 and the water reservoir 1 are designed to be integratedly connected, which obviously reduces the space occupied by the heat dissipation device 3, thereby facilitating the installation and use. Referring to FIG. 11 and FIG. 12, the heat dissipation device 3 may be installed at an angel with respect to the water reservoir 1. Referring to FIG. 13 and FIG. 14, the heat dissipation device and the water reservoir may also be installed in a straight line from left to right, installed on the wall of the pump housing at one side of the pumping device, or on the wall of the water reservoir at the other side.

Referring to FIG. 12, under the pressure of the pumping device 2, the liquid enters the water inlet ①, of the heat dissipation device 3 through the water outlet ⑩ of the pump housing. After cooling, the liquid directly enters the water outflow tank 12 from the water outlet ②, and is uniformly shunted along the flowing direction from ② to ③ to flow into the water outlets ④-① and ④-② on the outflow tank 12. After that, the liquid respectively enters the heat absorption device 4 that are connected thereto through the water inlets ⑤-① and ⑤-②, then the liquid is distributed to the water inlets ⑦-② and ①-① of the water inflow tank 11 through the water inlets ⑥-① and ⑥-②, and finally flows into the pumping device 2 along the instructed directions ⑧ and ⑨, thereby getting ready for the next heat dissipation circulation. The liquid circulation process of the liquid-cooled system of FIG. 13 is similar to that of FIG. 12, so it will not be described in detail herein.

Figure 15:
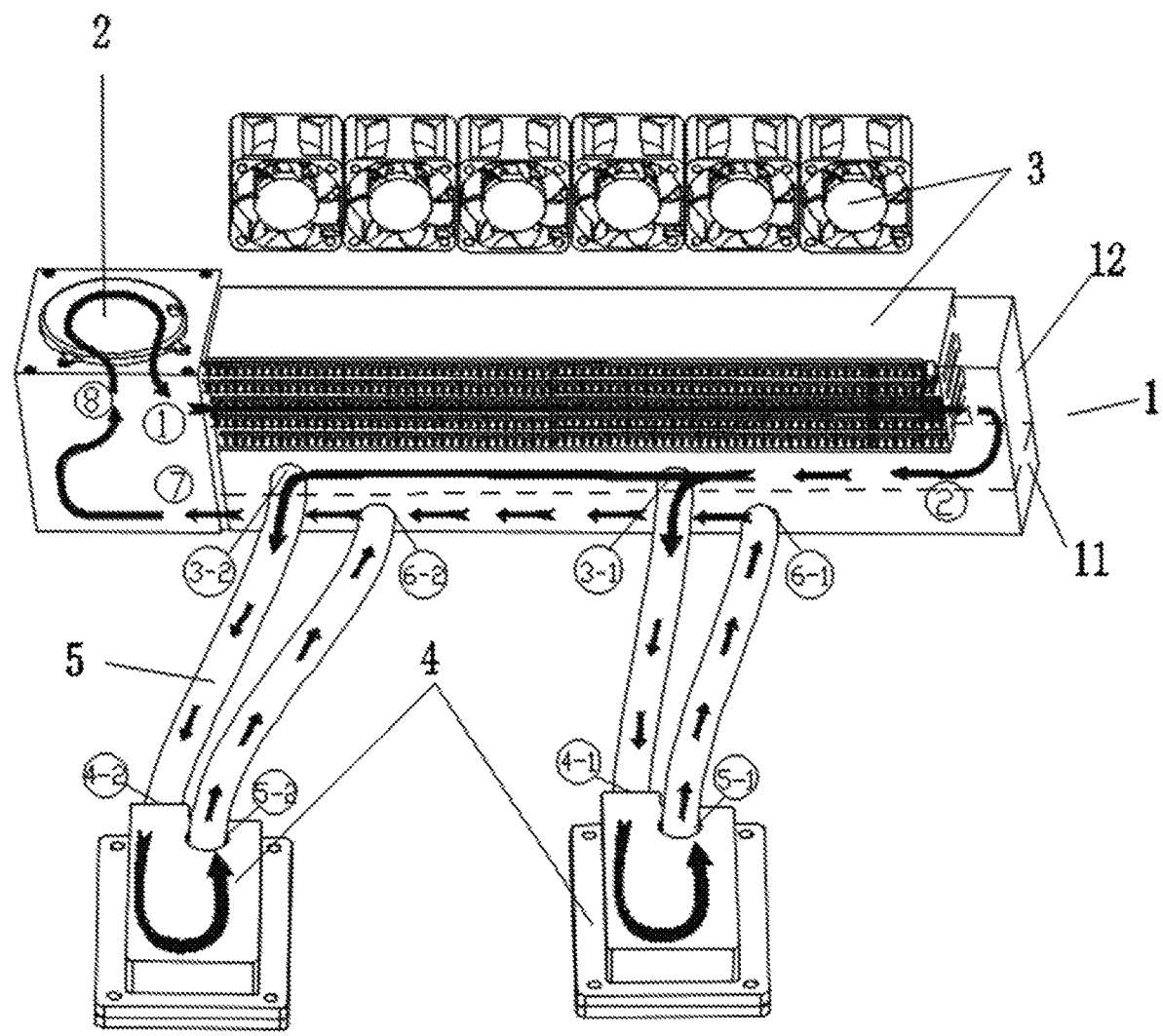
FIG. 15 is a schematic diagram showing the heat dissipation device of the liquid-cooled heat dissipation system of the present invention being connected to the water reservoir with the integrated structure in a top-bottom manner, and the liquid circulation flow thereof.

Further, referring to FIG. 15, the heat dissipation device 3 may also be installed on the top of the water reservoir 1, which can further reduce the occupied space and facilitate the use, compared with the angled or straight line design.

In detail, the liquid pumped by the pumping device 2 flows to the heat dissipation device 3 through the water inlet ① of the heat dissipation device 3, and then flows into the water outflow tank 12 through the water outlet ② of the heat dissipation device 3 after the heat dissipation. The liquid is shunted at the water outlets ③-① and ③-②, then flows into the heat absorption device 4 through the water inlets ④-① and ④-② of the heat absorption device 4. After absorbing heat, the liquid flows into the water inlets ⑥-① and ⑥-② on the water inflow tank 11 through the water outlets ⑤-① and ⑤-②. Then, the liquid flows out from the outlet ⑦ of the water inflow tank, and enters the pumping device through the inlet ⑧, thereby getting ready for the next liquid-cooled circulation.

It should be noted that, the power required for the liquid circulation of the present invention is all provided by the pumping device 2. The processing method for the integrated interconnection between the water reservoir and power system, and the structural design of integrated water reservoir, power system and the heat dissipation device includes but not limited to welding, casting, numerical control milling machining and 3D printing molding. The pipelines may be made of metal, rubber, etc. The pumping device may be a centrifugal pump, an axial flow pump, and a mixed-flow pump. The heat dissipation device has the same design as the water reservoir, which can realize large-area heat dissipation. Namely, a plurality of small size heat dissipation devices from a large size heat dissipation device to accelerate the speed of heat dissipation. The connection mode between the heat dissipation device and the water reservoir may be welding, glue connection, etc. The heat absorption device connected to the inlet and outlet pipes of the same set may be further connected to other heat dissipation devices in series to dissipate heat from multiple heat absorption devices. The cooling fins of the heat dissipation device may be wave strip shaped or plate-shaped, etc.

The above descriptions merely involve the preferred embodiments of the present invention. Various changes or equivalent substitutions to these features and embodiments can be derived by those skilled in the art without departing from the spirit and scope of the invention. In addition, with the teachings of the present invention, these features and embodiments may be modified to adapt to the specific circumstances and materials without departing from the spirit and scope of the invention. Therefore, the present invention is not limited to the specific embodiments disclosed herein, and all the embodiments falling within the scope of the claims of the present application should be considered as falling within the scope of the present invention.

I claim:

1. A water reservoir of a liquid-cooled heat dissipation system, wherein the liquid-cooled heat dissipation system comprising the water reservoir, a power system, a heat absorption device, a heat dissipation device, and pipelines,
    wherein the water reservoir is interconnected integretedly in structure to the power system;
    the water reservoir is integrated in structure;
    an interior of the water reservoir is divided into at least one set of water inflow tank and at least one set of water outflow tank; and
    the set of water inflow tank and the set of water outflow tank are provided with at least two sets of water inlets and water outlets respectively.

2. The water reservoir of the liquid-cooled heat dissipation system according to claim 1, wherein,
    the power system is a pumping device;
    the pumping device comprises a pump housing, a pump core, and a motor;
    the pump housing is interconnected to the water reservoir with the integrated structure; and
    the pump core and the motor are configured on the pump housing.

3. The water reservoir of the liquid-cooled heat dissipation system according to claim 1, wherein the two set of water inlets and the water outlets are respectively connected to the heat absorption device through the pipelines, and are connected to at least two sets of the heat absorption devices.

4. The water reservoir of the liquid-cooled heat dissipation system according to claim 1, wherein
    the water reservoir is integrated in structure, and N water reservoirs are provided (N is greater than or equal to 1);
    the water reservoir is divided into a water inflow tank and a water outflow tank;
    a relative position of the water inflow tank and water outflow tank after division is angled, front-rear, top-bottom or left-right; or
    the water reservoir is cylinder-shaped, the water inflow tank and the water outflow tank correspond to an inner cylinder and an outer cylinder, respectively.

5. The water reservoir of the liquid-cooled heat dissipation system according to claim 1, wherein the pumping device is configured at a side, a middle, or both sides of the water reservoir.

6. The water reservoir of the liquid-cooled heat dissipation system according to claim 1, wherein
    the water reservoir is interconnected integretedly in structure to the power system; and
    a processing method of an integrated structure comprises a welding, a casting, a numerical control milling machining, or a 3D printing molding.

7. A liquid-cooled system made by using the water reservoir according to claim 1, comprising:
    the water reservoir, a power system, the heat absorption device, the heat dissipation device, and the pipelines;
    wherein, the water reservoir and the power system interconnected integretedly in structure to the water reservoir are connected integretedly in structure to the heat dissipation device.

8. A liquid-cooled system made by using the water reservoir according to claim 1, comprising:
    the water reservoir, the power system, the heat absorption device, the heat dissipation device, and the pipelines;
    wherein, the water reservoir and the power system interconnected integretedly in structure to the water reservoir are connected integretedly in structure to the heat dissipation device through the pipelines.

9. The liquid-cooled system according to claim 7, wherein
    the water reservoir and the power system interconnected integretedly in structure to the water reservoir are connected integretedly in structure to the heat dissipation device; and
    a relative position after connecting is, but not limited to, angled, top-bottom or left-right.

10. The liquid-cooled system according to claim 7, wherein
    the water reservoir and the power system interconnected integretedly in structure to the water reservoir are connected integretedly in structure to the heat dissipation device; and
    a processing method of an integrated structure comprises a welding, a casting, a numerical control milling machining or a 3D printing molding.

* * * * *